US 7,685,485 B2

(12) United States Patent
Vo et al.

(10) Patent No.: US 7,685,485 B2
(45) Date of Patent: Mar. 23, 2010

(54) FUNCTIONAL FAILURE ANALYSIS TECHNIQUES FOR PROGRAMMABLE INTEGRATED CIRCUITS

(75) Inventors: Binh Vo, San Jose, CA (US); Wan-Pin Hung, Saratoga, CA (US); David Huang, Fremont, CA (US); Peter Boyle, Mountain View, CA (US); Qi Richard Chen, Sunnyvale, CA (US); Kaiyu Ren, San Jose, CA (US); Adam J. Wright, San Jose, CA (US); John DiCosola, Pleasanton, CA (US); Laiq Chughtai, Fremont, CA (US); Seng Yew Lim, Penang (MY)

(73) Assignee: Altera Corporation, San Jose, CA (US)

( * ) Notice: Subject to any disclaimer, the term of this patent is extended or adjusted under 35 U.S.C. 154(b) by 786 days.

(21) Appl. No.: 10/698,739

(22) Filed: Oct. 30, 2003

(65) Prior Publication Data

US 2005/0022085 A1    Jan. 27, 2005

(51) Int. Cl.
*G01R 31/28* (2006.01)
(52) U.S. Cl. .......................... 714/725; 714/25
(58) Field of Classification Search ................. 714/725, 714/738
See application file for complete search history.

(56) References Cited

U.S. PATENT DOCUMENTS

| | | | | | |
|---|---|---|---|---|---|
| 5,410,552 | A | * | 4/1995 | Hosokawa | ................... 714/738 |
| 5,508,636 | A | * | 4/1996 | Mange et al. | ................. 326/38 |
| 5,790,771 | A | * | 8/1998 | Culbertson et al. | ............. 714/3 |
| 5,991,907 | A | * | 11/1999 | Stroud et al. | ................. 714/725 |
| 6,530,049 | B1 | * | 3/2003 | Abramovici et al. | ......... 714/725 |
| 6,772,402 | B2 | * | 8/2004 | Mortensen | ..................... 716/6 |
| 6,874,108 | B1 | * | 3/2005 | Abramovici et al. | ......... 714/725 |
| 6,966,020 | B1 | * | 11/2005 | Abramovici et al. | ......... 714/725 |
| 6,973,608 | B1 | * | 12/2005 | Abramovici et al. | ......... 714/725 |

* cited by examiner

*Primary Examiner*—Kevin L Ellis
*Assistant Examiner*—Steve Nguyen
(74) *Attorney, Agent, or Firm*—Townsend and Townsend and Crew LLP

(57) ABSTRACT

Techniques are provided for isolating failed routing resources on a programmable circuit. Failing test patterns and the test logs are fed to a Statistical Failure Isolation (SFI) tool. The SFI tool extracts failing paths from the test patterns. A statistical analysis is performed on interconnect resources related to failing paths. The resources on the paths are then tallied to create a histogram of resources. These resources are then be fed into an Adaptive Failure Isolation (AFI) tool to auto-generate verification patterns. A tester uses the verification patterns to isolate failed interconnect resources.

24 Claims, 3 Drawing Sheets

FUNCTIONAL FAILURE ANALYSIS TECHNIQUES FOR PROGRAMMABLE INTEGRATED CIRCUITS

BACKGROUND OF THE INVENTION

The present invention relates to techniques for testing programmable circuits, and more particularly, to techniques for isolating failed routing resources on a programmable integrated circuit.

Programmable integrated circuits include logic elements, memory, and conductors that are programmably connected in an interconnect structure. The logic elements and the connections to the conductors can be programmed according a number of different designs.

After a programmable circuit is manufactured, the logic elements, memory, and programmable connections in the interconnect structure are tested to ensure that they are operating properly. Tests are performed to detect the presence of manufacturing detects in the interconnect routing resources.

Locating failing routing resources is done manually. Upon encountering a low yielding lot, an engineer analyzes the testing logs to determine failing test patterns and nodes. The engineer then collects routing resources related to the failing nodes on each test pattern. From the collection, the engineer identifies the routing resources that most likely contain a defect. Then, the engineer creates test patterns to verify the failed routing resources and where the fault occurred. All this is done before submitting a sample for physical analysis. Physical analysis determines what process step caused the fault. Because most of these steps are performed manually, they can be very time consuming and are not cost effective.

Therefore, it would be desirable to provide techniques for testing programmable circuits to isolate failed routing resources that reduce the time spent by engineers to perform the tests.

BRIEF SUMMARY OF THE INVENTION

The present invention isolates failed routing resources on a programmable circuit. Failed test patterns and test logs are fed to a Statistical Failure Isolation (SFI) tool. The SFI tool extracts failed test paths from the failed test patterns. The routing resources on the test paths are then tallied to create a histogram of routing resources.

A statistical analysis is performed to identify the routing resources that occurred most often within the failed test paths. These routing resources are then be fed into an Adaptive Failure Isolation (AFI) tool to auto-generate new verification test patterns. A tester uses the new verification test patterns to isolate the failed routing resources.

Other objects, features, and advantages of the present invention will become apparent upon consideration of the following detailed description and the accompanying drawings, in which like reference designations represent like features throughout the figures.

DETAILED DESCRIPTION OF THE INVENTION

The present invention provides techniques for locating failed routing resources on a programmable integrated circuit. Programmable integrated circuits includes field programmable gate arrays (FPGA), programmable logic devices (PLD), programmable logic arrays (PLA), configurable logic arrays, etc. Although the present invention is discussed in part in the context of PLDs, it should be understood that techniques of the present invention can be utilized with any type of programmable integrated circuit.

Figure 1:
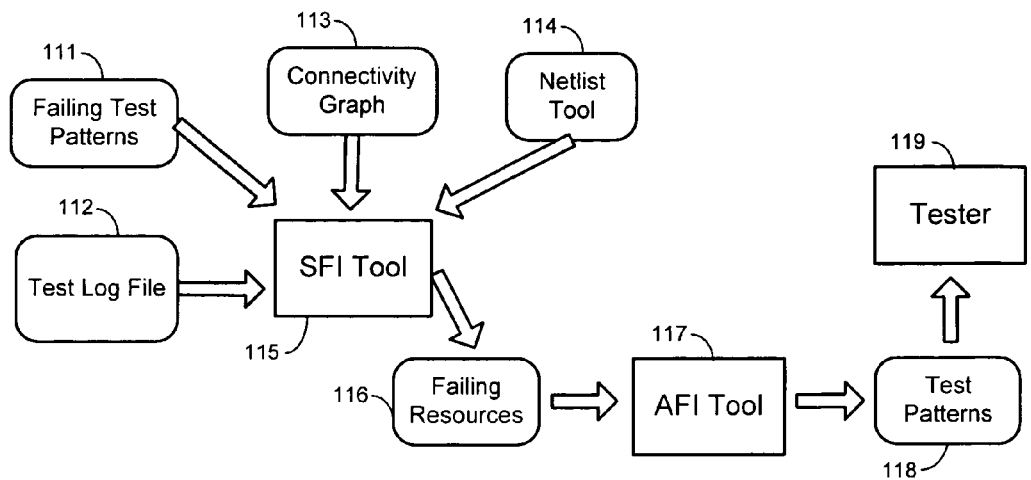
FIG. 1 illustrates a system that isolates failed routing resources on a programmable integrated circuit according to an embodiment of the present invention.

FIG. 1 is a diagram that illustrates a system for isolating failed resources on a programmable integrated circuit according to an embodiment of the present invention. The diagram shown in FIG. 1 illustrates a Statistical Failure Isolation (SFI) tool 115 and a Adaptive Failure Isolation (AFI) 117. The SFI and AFI tools are software tools.

SFI tool 115 receives failing test patterns 111 and test log file 112 as inputs. Failing test patterns 111 includes a file that contains a list of all of the test patterns that have failed during a previous test of the programmable circuit. Each test pattern among failed test patterns 111 corresponds to a test path across the programmable circuit. The failed test patterns are identified by applying test values to the test paths and comparing output values to expected values to determine which of the test patterns failed.

Each test path includes interconnect routing resources that are connected between a control point and an observation point. The control and observation points can be input/output pins or registers. The interconnect routing resources typically include wires and programmable interconnections that have been programmed to connect together the wires.

Figure 2A:
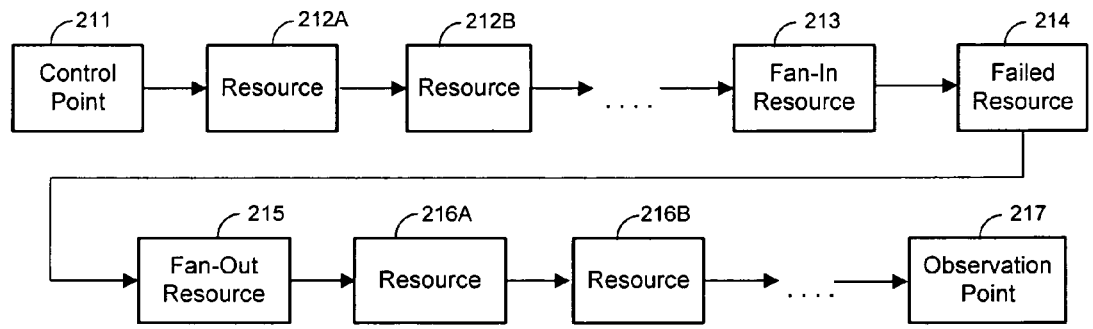
FIG. 2A illustrates an example of a test path that contains a failed resource according of an embodiment of the present invention.

FIG. 2A illustrates an example of a test path that includes a failed resource 214. This test path connects control point 211 to observation point 217 through routing resources 212-216. Failed resource 214 is coupled to a fan-in resource 213 and a fan-out resource 215. Fan-in resource 213 feeds signals into failed resource 214, and fan-out resource 215 receives signals from resource 214. A test path can include any number of additional routing resources such as resources 212A, 212B, 216A, and 216B.

The programmable interconnections are programmed by RAM bit address (RBA) bits to connect routing wires in the test paths. Each set of RBA bits also includes an address of a programmable interconnection that indicates its location on the programmable integrated circuit. Failing test patterns 111 include RBA program bits that indicate how the programmable connections are programmed in the failed test paths.

Test log file 112 contains entries that correspond to the test patterns that failed and coordinates of the programmable integrated circuit. Test log file 112 also includes a list of the observation points of the failed test paths among test patterns 111. Each of the observation points in file 112 generated output values that did not correspond to expected values after test values were applied to their respective control points. The observation points listed in file 112 correspond to the last point of each test path that generated a failed test value.

SFI tool 115 receives failing test patterns 111 and test log file 112. Using this information, SFI tool 115 extracts all of the resources that are connected along each of the failed test paths using connectivity graph 113. Connectivity graph 113 is a database that stores a map of all the possible programmable connections between routing resources on the programmable integrated circuit.

SFI tool 115 starts from the failed observation points and traces back to all of the drivers that are connected within the failed test paths to the failed observation points. SFI tool 115 performs this function by using information stored in connectivity graph 113 and the RBA program bits stored in failed test patterns 111. SFI tool 115 marks all the routing resources that are connected within each of the failed test paths.

According to another embodiment of the present invention, SFI tool 115 uses netlist tool 114 to identify all of the resources that are connected along each of the failed test paths. Netlist 114 is a software tool that corresponds RBA program bits to particular routing resources on the programmable integrated circuit. Netlist tool 114 is used to represent every possible programmable connection on the integrated circuit.

Many of the test paths that failed are routed through the same interconnect resources. Thus, there is overlap between routing resources that are used in the test paths.

The SFI tool 115 performs statistical analysis to determine which of the routing resources appear most frequently in the failed test paths. The resources can be grouped by individual resources or by resource types.

SFI tool 115 orders the overlapping resources according to how many times each resource appeared in one of the failed test paths. SFI tool 115 identifies the routing resources 116 that appear in the most failed test paths. SFI tool 115 can, for example, identify the top ten routing resources that appeared in the most failed test paths. These top 10 routing resources are the mostly likely sources of defects that are causing the failed test values.

By grouping together the most frequently occurring resources in the failed test paths, SFI tool 115 is better able to isolate the particular routing resources that are causing the test pattern failures. Specifically, if a particular routing resource contains a defect, that routing resource will cause failed test results in all of the test paths that are routed through it. Therefore, by identifying routing resources that overlap in the most failed test paths, the probability is greater that one or more the identified overlapping resources contain defects that are causing the erroneous test results.

According to another embodiment of the present invention, routing resources 116 that are connected within the most failed test paths are collected from a set of programmable integrated circuits that have the same architecture (e.g., a production run of a wafer). SFI tool 115 identifies the resources that occur most frequently in failed test paths that are generated for all of the programmable integrated circuits that are tested. By collecting test data from multiple programmable integrated circuits, the probability is further increased that the failed routing resources will be isolated, because SFI tool 115 has more failed test paths to work with.

After SFI tool 115 has identified resources 116 that occur most frequently in the failed test paths, a user can run AFI tool 117 on these resources to generate a new set of test patterns 118. The new set of test patterns 118 targets the resources that occurred the most in the failed test paths. Each test pattern can include values for testing as many test paths that can be tested on the programmable circuit at once. AFI tool 117 utilizes a background configuration file to create test patterns 118. The background configuration file contains predefined patterns for general routing testing that set up the programmable connections for the new test paths using RBA bits.

Figure 2B:
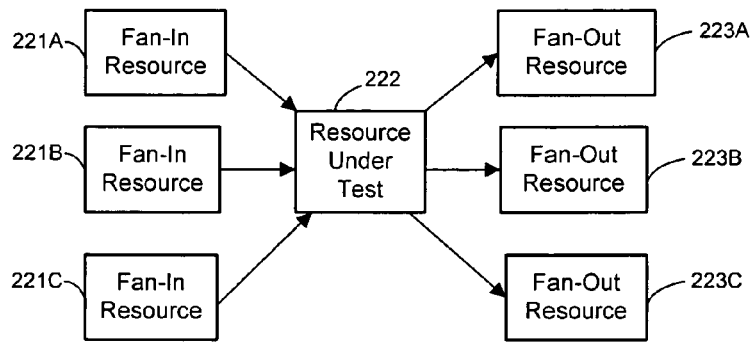
FIG. 2B illustrates an example of how fan-in resources and fan-out resources connect to a resource under test according to the present invention.

Test patterns 118 test every combination of the fan-in and fan-out resources that connect to failed resources 116. FIG. 2B illustrates an example of how a resource under test 222 can have programmable connections to multiple fan-in routing resources 221 and multiple fan-out routing resources 223. Test patterns 118 include test paths for every possible programmable connection between fan-in resources 221 and fan-out resources 223 that routes through resource under test 222. For example, test patterns 118 include a first test path that includes fan-in 221A, resource 222, and fan-out 223A; a second test path that includes fan-in 221A, resource 222, and fan-out 223B; a third test path that includes fan-in 221A, resource 222, and fan-out 223C, etc.

A tester system 119 then runs these new test patterns 118. After test patterns 118 have been run, tester 119 can more easily identify which of the routing resources are the source of the failures, because SFI tool 115 has substantially reduced the total number of resources being tested. Therefore, tester can 119 more easily determine which of the remaining routing resources are causing the failures based on new test patterns 118.

For example, a programmable circuit includes millions of routing resources. Most of these routing resources are tested during a first set of tests. The test patterns that fail during these tests are test patterns 111. As discussed above, SFI tool 115 isolates the routing resources that are the most likely sources of the failed test values. SFI tool 115 substantially reduces the number of suspect routing resources. Therefore, AFI tool 117 only needs to create test patterns for a far smaller number of routing resources (e.g., 10 resources).

Once the failed routing resources have been identified, the user determines the actual physical location of the failed resource on the programmable integrated circuit. The failed routing resource can be replaced or repaired according to a variety of well known techniques.

According to another embodiment, the techniques of the present invention can be used to test routing resources for clock and clear signals as well as routing resources for data signals. The AFI tool 117 can generate test patterns for clock and clear resources. If desired, only one resource or type of resource can be tested at once.

Figure 2C:
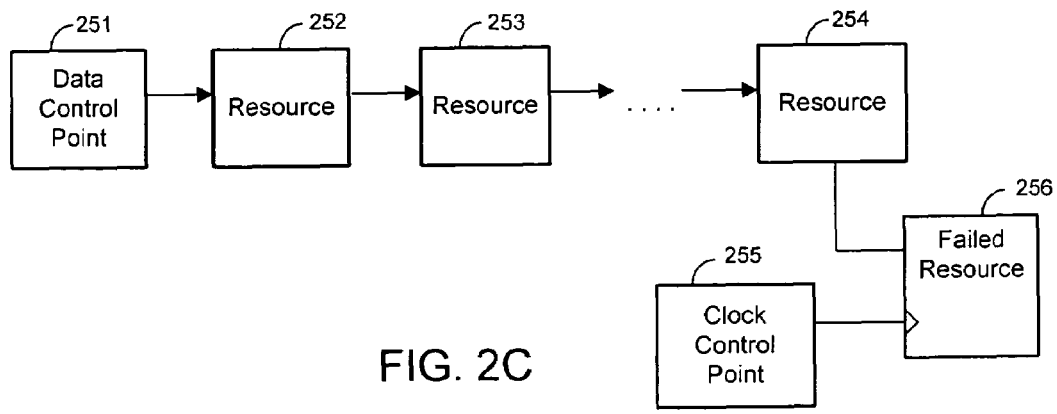
FIG. 2C illustrates an example of a test path for testing clock signal resources according to an embodiment of the present invention.

FIG. 2C illustrates a test path for testing clock signal resources according to an embodiment of the present invention. The test path includes a data control point 251, a resource 256 that has failed, and a clock control point 255. Signals that are scanned into data control point 251 are routed to failed resource 256 through intermediate resources 252, 253, 254, and any other intermediate resources. Data control point 251, failed resource 256, and clock control point 255 can be, for example, registers. Clock control point 255 can be a clock pin.

Figure 2D:
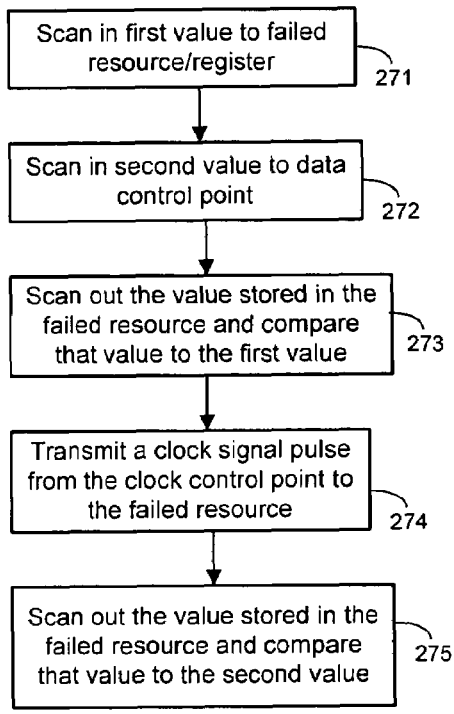
FIG. 2D is a flow chart that illustrates a process for testing clock signal resources according to an embodiment of the present invention.

FIG. 2D is a flow chart that illustrates a process for testing clock signal resources. At step 271, a first binary value (e.g., 1 or 0) is scanned into failed resource 256 using scan chain registers. Scan chain registers are an input path that is not shown in FIG. 2C. At step 272, a second binary value is scanned into the data control point 251. The first value is different from the second value. For example, if the first value is 1, the second value is 0.

At step 273, the value stored in the failed resource 256 is scanned out and compared to the first value. Failed resource 256 does not capture the second value scanned into data control point 251 until the clock signal from clock control point 255 pulses LOW. Therefore, at step 273, the value stored in failed resource 256 should equal the first value.

At step 274, a clock signal LOW pulse is transmitted from clock control point 255 to the clock input of failed resource 256. In response, failed resource 256 stores the second value from data control point 251. At step 275, the value stored in failed resource 256 is scanned out and compared to the second value. If the value stored in failed resource 256 does not match the second value, resources associated with the clock signal including clock control point 255 may contain a defect that caused the erroneous value.

The process steps 271-275 of FIG. 2D are repeated a second time to test clock signal resource 255. During the second iteration of steps 271-275, different binary values are scanned into failed resource 256 and data control point 251. For example, if 0 was scanned into failed resource 256, and 1 was scanned into data control point 251 during the first iteration of steps 271-275, a 1 is scanned into failed resource 256, and a 0 is scanned into data control point 251 during the second iteration of steps 271-275.

Figure 2F:
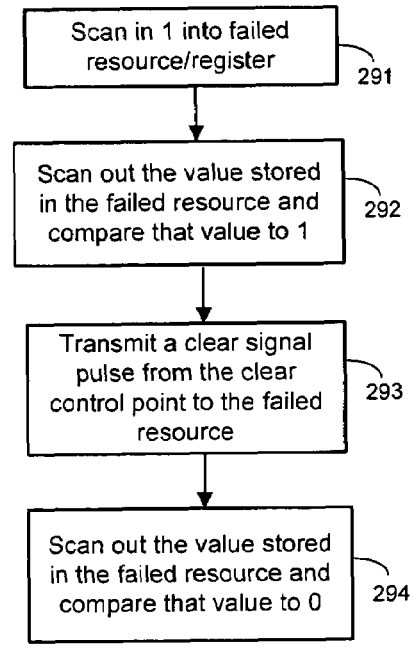
FIG. 2F is a flow chart that illustrates a process for testing clear signal resources according to an embodiment of the present invention.
Figure 2E:
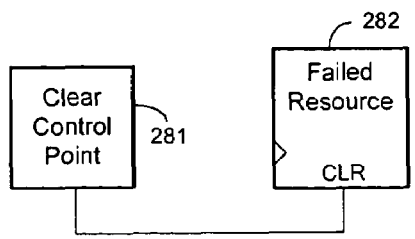
FIG. 2E illustrates an example of a test path for testing clear signal resources according to an embodiment of the present invention.

FIG. 2E illustrates a test path for testing clear signal resources according to an embodiment of the present invention. Sometimes resources that transmit a clear signal may not cause a register to clear its stored contents to 0. The clear signal tests of the present invention can determine if the clear signal resources are not causing the register to clear its contents properly.

The test path of FIG. 2E includes clear control point 281 and failed resource 282. Clear control point 281 generates a clear signal. The clear signal causes failed resource 282 to store a 0, regardless of its current contents.

Clear control point 281 is not a register, and therefore a 1 or 0 value is not scanned into it. Clear control point 281 may be, for example, a clock pin.

FIG. 2F is a flow chart that illustrates a process for testing clear signal resources. At step 291, a 1 binary value is scanned into failed resource/register 282 through scan chain registers. At step 292, the value stored in the failed resource 282 is scanned out and compared to 1. The value stored in failed resource 282 should equal 1, if resources 282 itself is operating properly.

At step 293, a clear signal LOW pulse is transmitted through clear control point 281 to the failed resource 282. The clear signal LOW pulse clears the value 1 stored in failed resource 282. At step 294, the value stored in failed resource 282 is scanned out through the scan chain registers and compared to 0. If the value stored in failed resource 282 is 0, then the clear signal resources including clear control point 281 are operating properly. However, if the value stored in failed resource 282 is not 0, a defect in the clear signal resources may be the reason that resource 282 has stored an erroneous value.

Figure 3:
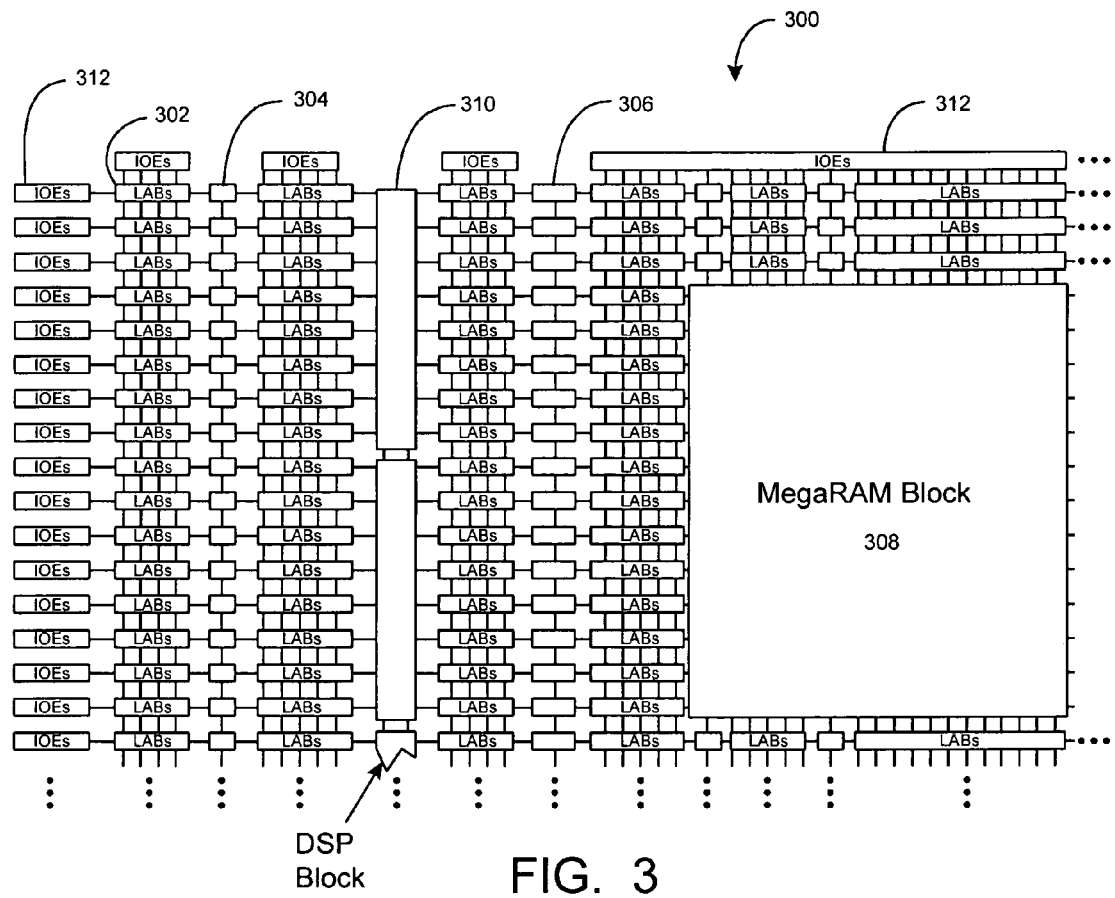
FIG. 3 is a simplified block diagram of a programmable logic device that can implement embodiments of the present invention.

FIG. 3 is a simplified partial block diagram of an exemplary high-density PLD 300 wherein techniques of the present invention can be utilized. PLD 300 includes a two-dimensional array of programmable logic array blocks (or LABs) 302 that are interconnected by a network of column and row interconnects of varying length and speed. LABs 302 include multiple (e.g., 10) logic elements (or LEs), an LE being a small unit of logic that provides for efficient implementation of user defined logic functions.

PLD 300 also includes a distributed memory structure including RAM blocks of varying sizes provided throughout the array. The RAM blocks include, for example, 512 bit blocks 304, 4K blocks 306 and a MegaBlock 308 providing 512K bits of RAM. These memory blocks can also include shift registers and FIFO buffers. PLD 300 further includes digital signal processing (DSP) blocks 310 that can implement, for example, multipliers with add or subtract features. I/O elements (IOEs) 312 located, in this example, around the periphery of the device support numerous single-ended and differential I/O standards. It is to be understood that PLD 300 is described herein for illustrative purposes only and that the present invention can be implemented in many different types of PLDs, FPGAs, and the like.

Figure 4:
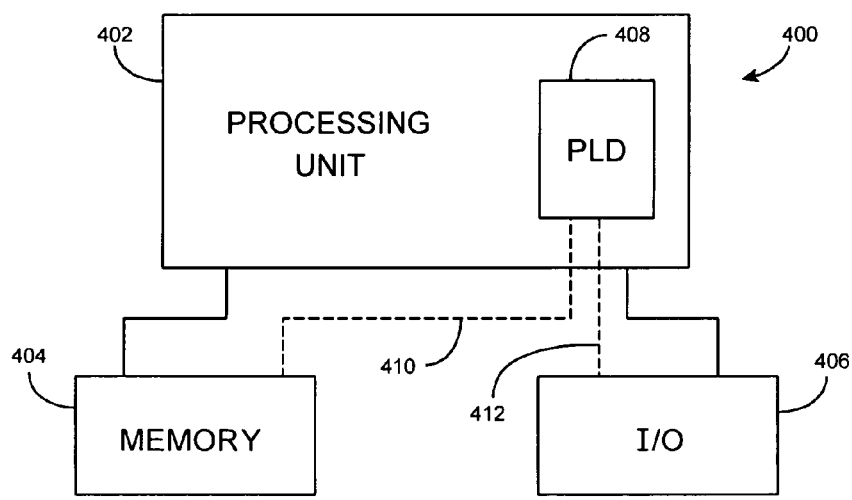
FIG. 4 is a block diagram of an electronic system that can implement embodiments of the present invention.

While PLDs of the type shown in FIG. 3 provide many of the resources required to implement system level solutions, the present invention can also benefit systems wherein a PLD is one of several components. FIG. 4 shows a block diagram of an exemplary digital system 400, within which the present invention can be embodied. System 400 can be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 400 can be provided on a single board, on multiple boards, or within multiple enclosures.

System 400 includes a processing unit 402, a memory unit 404 and an input/output (I/O) unit 406 interconnected together by one or more buses. According to this exemplary embodiment, a programmable logic device (PLD) 408 is embedded in processing unit 402. PLD 408 can serve many different purposes within the system in FIG. 4. PLD 408 can, for example, be a logical building block of processing unit 402, supporting its internal and external operations. PLD 408 is programmed to implement the logical functions necessary to carry on its particular role in system operation. PLD 408 can be specially coupled to memory 404 through connection 410 and to I/O unit 406 through connection 412.

Processing unit 402 can direct data to an appropriate system component for processing or storage, execute a program stored in memory 404 or receive and transmit data via I/O unit 406, or other similar function. Processing unit 402 can be a central processing unit (CPU), microprocessor, floating point coprocessor, graphics coprocessor, hardware controller, microcontroller, programmable logic device programmed for use as a controller, network controller, and the like. Furthermore, in many embodiments, there is often no need for a CPU.

For example, instead of a CPU, one or more PLDs 408 can control the logical operations of the system. In an embodiment, PLD 408 acts as a reconfigurable processor, which can be reprogrammed as needed to handle a particular computing task. Alternately, programmable logic device 408 can itself include an embedded microprocessor. Memory unit 404 can be a random access memory (RAM), read only memory (ROM), fixed or flexible disk media, PC Card flash disk memory, tape, or any other storage means, or any combination of these storage means.

While the present invention has been described herein with reference to particular embodiments thereof, a latitude of modification, various changes, and substitutions are intended in the present invention. In some instances, features of the invention can be employed without a corresponding use of other features, without departing from the scope of the invention as set forth. Therefore, many modifications may be made to adapt a particular configuration or method disclosed, without departing from the essential scope and spirit of the present invention. It is intended that the invention not be limited to the particular embodiments disclosed, but that the invention will include all embodiments and equivalents falling within the scope of the claims.

What is claimed is:

1. A method for isolating failed routing resources on a programmable integrated circuit, the method comprising:
receiving a first plurality of failed test patterns, wherein a test pattern includes program bits that define how routing resources on the programmable integrated circuit are connected to form a test path, wherein a test pattern is designated as failing when a result from a test path is erroneous, wherein the result of the failed test path is created by applying one or more test values to the failed test path;
identifying a subset of the routing resources on the programmable integrated circuit based only on test patterns that have failed wherein the subset comprises one or more routing resources that respectively occur in the most failed test paths; and
generating new test patterns including program bits that define new test paths for testing the subset of the routing resources, wherein each of the new test paths includes:
the first routing resource; and
a combination, not included in the other new test paths, of fan-in and fan-out resources that are programmably connectable to the first routing resource,
wherein the new test paths test every combination of fan-in and fan-out resources that are programmably connectable to the first routing resource.

2. The method according to claim 1 further comprising:
running the new test patterns using a test system to isolate routing resources among the subset of the routing resources that caused the erroneous results in the failed test patterns.

3. The method according to claim 1 wherein generating the new test patterns includes program bits that define new test paths for testing every routing resource of the subset; and
wherein for each routing resource of the subset, the new test paths route through every combination of fan-in resources and fan-out resources that are programmably connectable to that routing resource of the subset.

4. The method according to claim 1 wherein generating the new test patterns for the subset of the routing resources further comprises:
generating new test patterns for test paths that route through clock and clear signal routing resources.

5. The method according to claim 1 wherein each of the failed test paths and the new test paths connect a control point to an observation point on the programmable integrated circuit.

6. The method according to claim 5 further comprising:
receiving a test log file that indicates the observation points for the failed test paths.

7. The method according to claim 1 wherein the routing resources have more than 1000 times as many routing resources as the subset of routing resources.

8. The method according to claim 1 wherein identifying the subset of the routing resources that occur most frequently in the failed test paths further comprises:
extracting the routing resources that are connected along each of the failed test paths using a connectivity graph.

9. The method of claim 1, wherein each of the new test paths is used to determine whether the resources of the subset have actually failed.

10. The method of claim 1, wherein the erroneous result of a failed test path is an output value of the failed test path that does not equal an expected value.

11. The method of claim 1, further comprising:
receiving a second plurality of failed test patterns resulting from applying one or more test values to tests paths on one or more other programmable integrated circuits that are not integrated with the programmable integrated circuit, wherein the other programmable circuits have a same architecture as the programmable integrated circuit, wherein identifying a subset of the routing resources on the programmable integrated circuit based only on test patterns that have failed includes using the first plurality of failed test patterns and the second plurality of failed test patterns.

12. A computer program product encoded on a computer readable medium for directing a processor to isolate failed routing resources on a programmable integrated circuit, the computer readable medium comprising:
code for receiving a plurality of failed test patterns generating erroneous results when test values are applied to a set of failed test paths, wherein a test pattern includes program bits that define how routing resources on the programmable integrated circuit are connected to form a test path;
code for identifying a subset of the routing resources on the programmable integrated circuit based only on test patterns that have failed wherein the subset comprises one or more routing resources that respectively occur in the most failed test paths; and
code for generating new test patterns including program bits that define new test paths for testing the subset of the routing resources, wherein each of the new test paths includes:
the first routing resource; and
a combination, not included in the other new test paths, of fan-in and fan-out resources that are programmably connectable to the first routing resource,
wherein the new test paths test every combination of fan-in and fan-out resources that are programmably connectable to the first routine resource.

13. The computer program product of claim 12 wherein the code for receiving and identifying further comprises:
code for receiving a test log file that indicates observation points for the failed test paths.

14. The computer program product of claim 12 wherein the code for generating further comprises:
code for generating new test patterns for test paths that route through clock and clear signal routing resources.

15. The computer program product of claim 12 further comprising:
code for testing the new test patterns to isolate routing resources among the subset that caused the erroneous results in the failed test patterns.

16. The computer program product of claim 12 wherein the code for generating further comprises:
code for generating new test patterns that route through every combination of fan-in resources and fan-out resources that are programmably connectable to each of the subset of the routing resources.

17. The computer program product of claim 12 wherein the routing resources have more than 10,000 times as many routing resources as the subset of the routing resources.

18. The computer program product of claim 12, wherein the code for generating further comprises:

code for receiving a second plurality of failed test patterns resulting from applying one or more test values to tests paths on one or more other programmable integrated circuits that are not integrated with the programmable integrated circuit, wherein the other programmable circuits have a same architecture as the programmable integrated circuit, wherein identifying a subset of the routing resources on the programmable integrated circuit based only on test patterns that have failed includes using the first plurality of failed test patterns and the second plurality of failed test patterns.

19. A computer system for isolating failed routing resources on a programmable integrated circuit, the computer system comprising a computer readable medium for directing a processor to isolate failed routing resources on a programmable integrated circuit, the computer readable medium comprising:

code for a statistical failure isolation (SFI) tool, wherein the SFI tool:
(a) receives a file including a plurality of failed test patterns that generated erroneous results when test values were applied to a set of failed test paths, wherein a test pattern includes program bits that define how routing resources on the programmable integrated circuit are connected to form a test path;
(b) determines routing resources along each failed test path;
(c) calculates a total number of occurrences of each resource in the failed test paths received in the file, at least one resource occurring in two failed test paths; and
(d) identifies a subset of the routing resources based only on the test patterns that have failed, wherein the subset comprises one or more resources having the highest number of occurrences; and code for an adaptive failure isolation (AFI) tool that subsequent to completion of (b)-(d) generates new test patterns including program bits that define new test paths for testing the subset of the routing resources, wherein each of the new test paths includes:
the first routing resource; and
a combination, not included in the other new test paths, of fan-in and fan-out resources that are programmably connectable to the first routing resource,
wherein the new test paths test every combination of fan-in and fan-out resources that are programmably connectable to the first routing resource.

20. The computer system according to claim 19 wherein the SFI tool also receives a test log file that indicates observation points for the failed test paths.

21. The computer system according to claim 19 further comprising:
a test system that tests the new test patterns to isolate routing resources among the subset that caused the erroneous results in the failed test patterns.

22. The computer system according to claim 19 wherein the routing resources have more than 1000 times as many routing resources as the subset of routing resources.

23. The computer system according to claim 19 wherein the SFI tool extracts the routing resources that are connected along each of the failed test paths using a connectivity graph.

24. The computer system according to claim 19, wherein the SFI tool also receives a second plurality of failed test patterns resulting from applying one or more test values to tests paths on one or more other programmable integrated circuits that are not integrated with the programmable integrated circuit, wherein the other programmable circuits have a same architecture as the programmable integrated circuit, and wherein the SFI tool is configured to use the plurality of failed test patterns and the second plurality of failed test patterns to identify the subset of the routing resources based only on test patterns that have failed.

* * * * *